United States Patent [19]

Miyazaki et al.

[11] Patent Number: 5,069,244

[45] Date of Patent: Dec. 3, 1991

[54] LIQUID SOURCE CONTAINER DEVICE

[75] Inventors: Shinji Miyazaki, Yokohama; Yoshitaka Tsunashima, Tokyo, both of Japan

[73] Assignee: Kabushiki Kaisha Toshiba, Kawasaki, Japan

[21] Appl. No.: 635,655

[22] Filed: Dec. 28, 1990

[30] Foreign Application Priority Data

Jan. 11, 1990 [JP] Japan ..................................... 2-4337

[51] Int. Cl.⁵ ............................................. F17C 13/00
[52] U.S. Cl. ..................................... 137/209; 137/240
[58] Field of Search ................................ 137/240, 209

[56] References Cited

U.S. PATENT DOCUMENTS 4,622,988 11/1986 Takimoto ............................. 137/209
4,941,593 7/1990 Hicks .................................... 137/240

FOREIGN PATENT DOCUMENTS 0165493 12/1985 European Pat. Off. .

OTHER PUBLICATIONS

Patent Abstracts of Japan, vol. 13, No. 575 (C-667) [3923], 9/1989.

Primary Examiner—Alan Cohan
Attorney, Agent, or Firm—Finnegan, Henderson, Farabow, Garrett, and Dunner

[57] ABSTRACT

A liquid source container device is used for a liquid gas source for a semiconductor manufacturing device. This container device includes a main body for containing a source liquid, to which a gas supply line for transferring the source liquid, and a source liquid delivery line for delivering the liquid are connected. The gas supply line has first and second gas supply valves provided thereon, and the liquid delivery line has first and second liquid delivery valves also provided thereon. A section of the gas supply line which is located between the first and second gas supply valves and a section of the liquid delivery line which is located between the first and second delivery valves are connected with each other by means of a purge line which has a purge valve provided thereon. By operating the purge line, the purge valve, and the four valves, the efficiency of purge-drying procedures carried out before and after transferring the source liquid, is improved, and therefore the container device, as well as the semiconductor manufacturing device can be prevented from being contaminated.

7 Claims, 3 Drawing Sheets

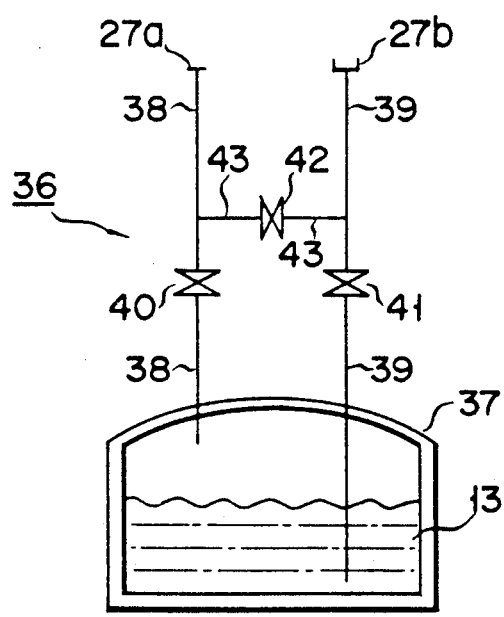
F I G. 4

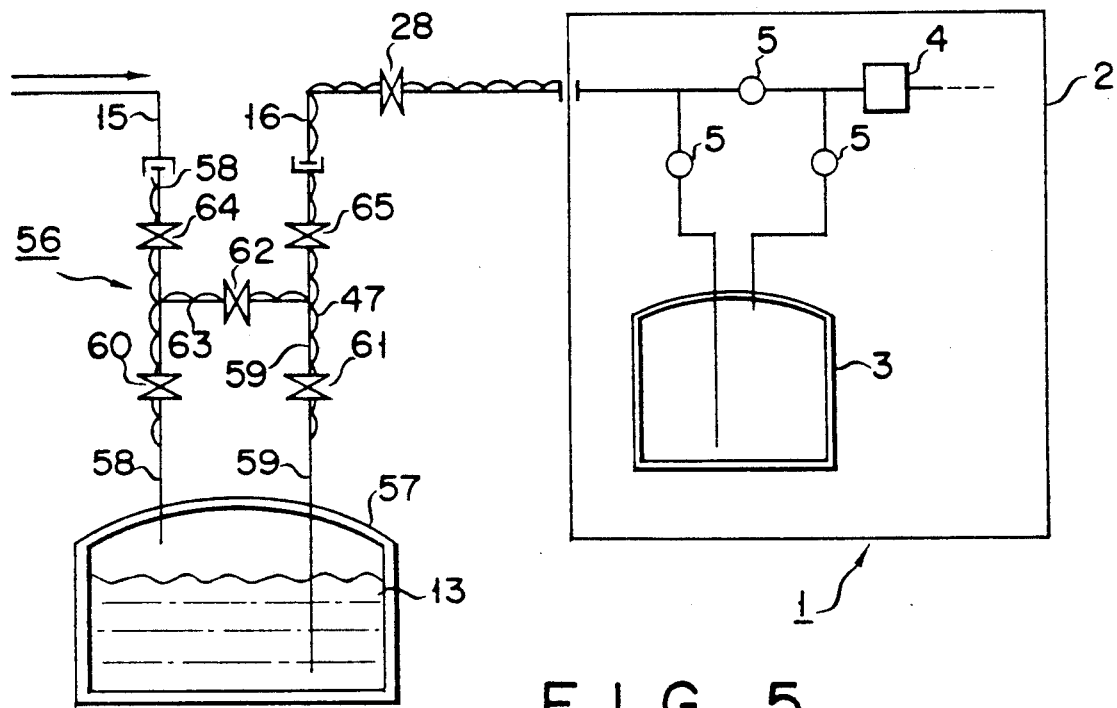
F I G. 5
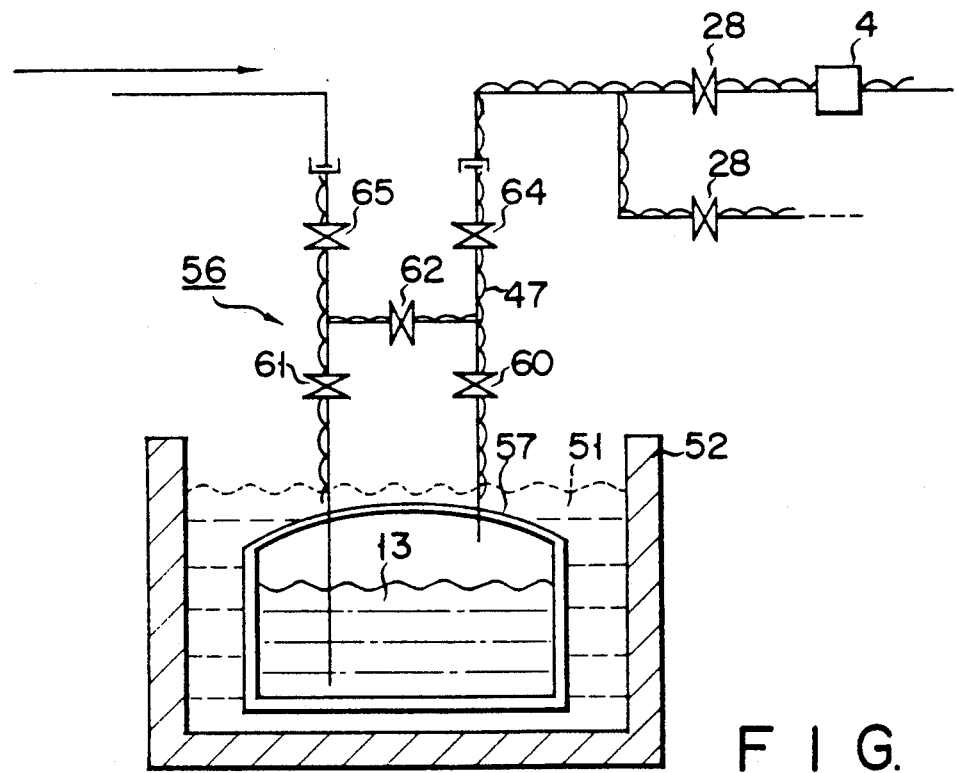
F I G. 6

LIQUID SOURCE CONTAINER DEVICE

BACKGROUND OF THE INVENTION

1. Field of the Invention

The present invention relates to a container device used for a source of a liquified gas, and, more specifically, to a container device having an out-take pipe mechanism, and which is used in a semiconductor production step.

2. Description of the Related Art

Liquid material gasification control devices (called "baking systems" hereinafter) having a mechanism for gasifying a liquid gas so that it can be handled as regular gas, have hitherto been used in a semiconductor production apparatus as prestage equipment to a CVD (chemical vapor deposition) reaction furnace. FIG. 1 shows an example of the main structure of such an apparatus. As shown in this figure, the baking system 1 includes a constant temperature room 2, a tank 3, a flow controller 4, and a pneumatic valve 5. A source liquid container device 6 of the type most often employed supplies a liquid material into the system 1.

The source liquid container device 6 includes a main body 7, a gas supply line 8, a source liquid delivery line 9, a gas supply valve 10, a liquid delivery valve 11, and the like. The container device 6 is connected by a joint 12 to the system, and can be removed therefrom. A gas supply company fills the container device 6 with a source liquid 13, using a method similar to that used in the case of regular gases, and supplies the gas-filled container to a semiconductor maker.

To transfer the source liquid, a purge valve 14 is closed, and the gas supply valve 10 and the delivery valve 11 are opened. Then, a compressed inert gas is introduced into the main body 7, through the gas supply lines 15 and 8, causing the source liquid 13 to flow via pipes 9 and 16 into the tank 3 of the baking system. At this time, the tank 3 is in an unpressurized state.

The source liquid is then gasified in the tank 3 by using the constant temperature room 2, the gasified source passes through the flow controller 4, and is drawn into a reaction furnace through a gas line connected to the furnace.

An example of the source liquid 13 which is used in this method, is an organic source liquid such as tetraethoxysilane $Si(OC_2H_5)_4$ (to be abbreviated to TEOS hereinafter) to form an insulation layer on a semiconductor substrate. In certain cases, an organic source liquid containing a doping material such as phosphor (P), boron (B), arsenic (As), or the like is used to form a film which includes impurities to be diffused in a semiconductor substrate.

To replenish the tank with the source liquid 13, usually, the container device 6 is removed from joint 12 as mentioned before, and sent to the gas supply company for replenishment. Consequently, the connection pipes 15 and 16, and those sections of the lines 8 and 9 which are located between the joints 12 and the valves 10 and 11 of the container device 6 are brought into direct contact with the atmosphere every time the tank is replenished.

In the meantime, just after the source liquid is transferred, some of the source liquid still remains on the inner surface of the connection pipe 16 and the like. The organic source liquid used in this method reacts, though moderately, with moisture in the atmosphere to produce byproducts such as silica ($SiO_2$).

The prior art was designed to avoid the problems associated with the remaining of liquid. To remove the remaining liquid, the purge valve 14 is opened and the valves 10 and 11 are closed to flow an inert gas through the connection pipe and the like to carry out purge drying both before and after transferring the source liquid. However, with this prior art, it is very difficult to perform perfect purge drying because the pipes 15 and 16 which continue from the purge line (the line for a purge gas) to the valves 10 and 11, are too long, and they are not designed for making a purge gas to flow. If purge drying is not complete, the byproduct such as silica is produced on the inner surface of the connection pipe 16, the valves 10 and 11, and the like, as stated before. This byproduct contaminates the container device 6, the baking system 1, and a to-be-processed material. Further, it is likely to be mixed into the liquid in the tank 3 in the baking system 1, causing failure of the flow controller 4. In the case of handling a source liquid containing a doping material such as phosphor or arsenic, an incomplete purge causes generation of a poisonous gas with irritating smell, which affects human health. Therefore, the purge operation must be carried out very carefully.

As described, both before and after transferring the source liquid to the baking system, the source liquid remaining on the inner surfaces of the connection pipe connected to the system, and of the line of the container device must be completely removed by the purge drying. However, the complete purge effect cannot be obtained in the conventional source liquid container device; therefore the container device itself and the baking system are contaminated, affecting the quality of a to-be-processed substrate such as a wafer. Further, with the conventional container device, very special attention must be paid in order to operate the system in safety when handling a source liquid containing a poisonous substance such as phosphor, arsenic or the like.

SUMMARY OF THE INVENTION

The present invention is designed to solve the above-stated problems, and the purpose thereof is to provide a source liquid container device, with which a safe operation can be assured, the purging efficiency during operation of transferring a source liquid is improved, and contamination of the source liquid container device, the semiconductor production device such as the baking system, and to-be-processed materials, is prevented.

This purpose can be achieved by the device of the present invention which has the following structure. That is, the source liquid container device of the present invention comprises a main body for containing a source liquid, a gas supply line connected to the main body to transfer the source liquid by pressure, first and second gas supply valves provided on the gas supply line, a source liquid delivery line connected to the main body for delivering the source liquid, first and second source liquid delivery valves provided on the source liquid delivery line, a purge line, one end of which being connected to a section of the gas supply line located between the first and second gas supply valves, and the other end being connected to a section of the source liquid delivery line located between the first and second source liquid delivery valves, and a purge valve provided on the purge line.

With the source liquid container device of the present invention, the purge efficiency before and after transferring the source liquid is greatly improved by means of the purge line, the purge valve, and the four valves provided adjacent to the main body. Further, of the source liquid container device, the semiconductor manufacture device such as a baking system, and to-be-processed material is prevented. Thus, the productivity and the reliability of the device is increased. In the meantime, the safety of the operation can be assured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a source liquid container device developed in the course of the present invention;

FIG. 5 shows another embodiment and transferring system of a source liquid container device of the present invention; and FIG. 6 illustrates an example of application of the source liquid container device shown in FIG. 5.

DETAILED DESCRIPTION OF THE PREFERRED EMBODIMENTS

Figure 2:
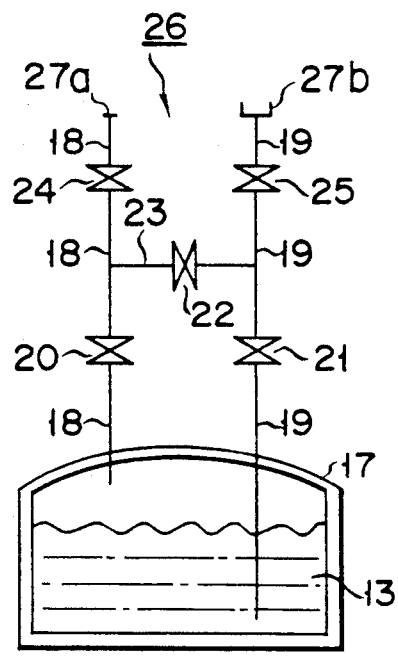
FIG. 2 shows an embodiment of a source liquid container device according to the present invention.

The source liquid container device of the present invention, as shown in FIG. 2, comprises a main body 17 for containing a source liquid 13, a gas supply line 18 for transferring the source liquid 13 by pressure, the first and second gas supply valves 20 and 24 provided on the gas supply line 18, the source liquid delivery line 19 for delivering the source liquid 13, the first and second source liquid delivery valves 21 and 25 provided on the source liquid delivery line 19, the purge line 23, one end of which being connected to a section of the gas supply line 18 located between the first and second gas supply valves 20 and 24, and the other end being connected to a section of the source liquid delivery line 19 located between the first and second source liquid delivery valves 21 and 25, and the purge valve 22 provided on the purge line 23. In addition, it is very preferable to provide the gas supply line 18, the source liquid delivery line 19 and the purge 23 of the container device of the present invention with heating mechanisms, and such a structure is a very good example of the invention.

Figure 3:
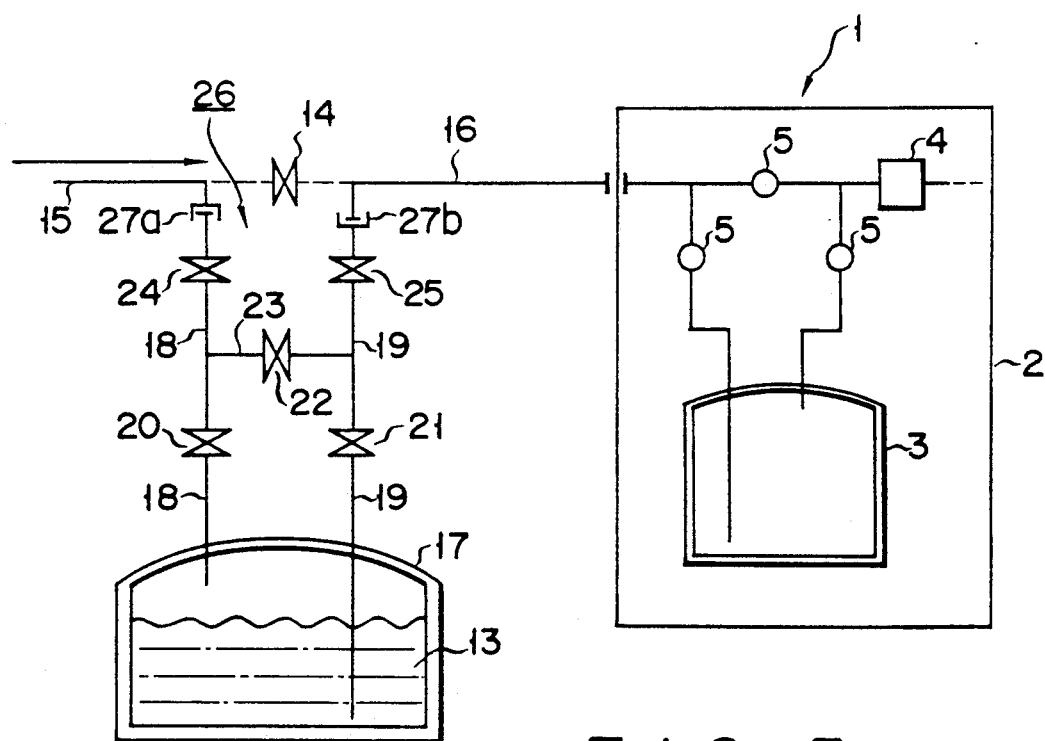
FIG. 3 illustrates a source liquid container device and a transferring system for the embodiment shown in FIG. 2.

The present invention will be described with reference to FIG. 3.

When the source liquid is to be transferred, the purge valve 22 is closed, and the gas supply valves 20 and 24, and the delivery valves 21 and 25 are opened.

Then, a compressed inert gas is introduced into the main body 17, through the gas supply line 18, and causes the source liquid 13 to flow, via the delivery line 19 and the connection pipe 16, into the baking system 1. The source liquid 13 is then gasified mainly in the tank 3, and the gasified source passes through the flow controller 4, and is drawn into a reaction furnace through a gas line connected to the furnace by vacuum suction.

Before and after transferring the source liquid, the liquid remaining on the inner surfaces of the connection pipe and the like, is to be purge-dried. To carry out the purge-drying, the first gas supply valve 20 and the first liquid source delivery valve 21 are closed, and the second gas supply valve 24, the purge valve 22, and the second liquid source delivery valve 25 are opened. Then, an inert gas is made to flow through the gas supply pipe 15, the gas supply line 18, the purge line 23, the source liquid delivery line 19, and the connection pipe 16, into the baking system 1, so as to perform the purge-drying in the system.

When the source liquid container device 26 is to be removed, the second gas supply valve 24, the purge valve 22, and the second source liquid delivery valve 25 are closed after the purge-drying, and then the source liquid container device 26 is removed by disjointing the joints 27a and 27b.

A characteristic of the container device of the present invention is that the purge line 23 and the purge valve 22 belong to the container device 26, and are provided adjacent to the main body 17. Consequently, it has become possible to flow a purging inert gas directly into a part of the connection pipe 16, the delivery line 19 and the like, which the conventional technique could not achieve. More specifically, a purging inert gas flows through the pipe or pipeline upstream the first gas supply valve 20 provided adjacent to the main body, that downstream the first delivery valve 21; therefore the purge efficiency (completely purging poisonous materials out of a pipe in a short period of time) is greatly improved. Thus, the source liquid container device, the baking system, and to-be-processed material such as a wafer or the like can be prevented from contamination.

The other characteristic of the present invention is that the first and second valves 20 and 24, and the valves 21 and 25 are provided for the gas supply line 18 and the liquid delivery line 19, respectively. After completion of purge-drying, the second valves 24 and 25 are closed. At this time, the four valves 20, 24, 21, and 25 are all closed, and an inert gas is held in the gas supply line 18, the delivery line 19, and the purge line 23 sealed by the four valves. Thus, the source liquid or gas in the container main body 17 is communicated with the atmosphere outside the container device 26 via the inert gas. With this structure, even if any of the valves are accidentally opened while removing the container device 26, the poisonous gas, i.e. the byproduct of the source liquid will not be released out to the room. Accordingly, the safety of the operation can be assured far more than the case of the conventional technique.

The embodiment of the present invention will be described along with the course to the accomplishment of the invention with reference to the drawings.

Figure 1:
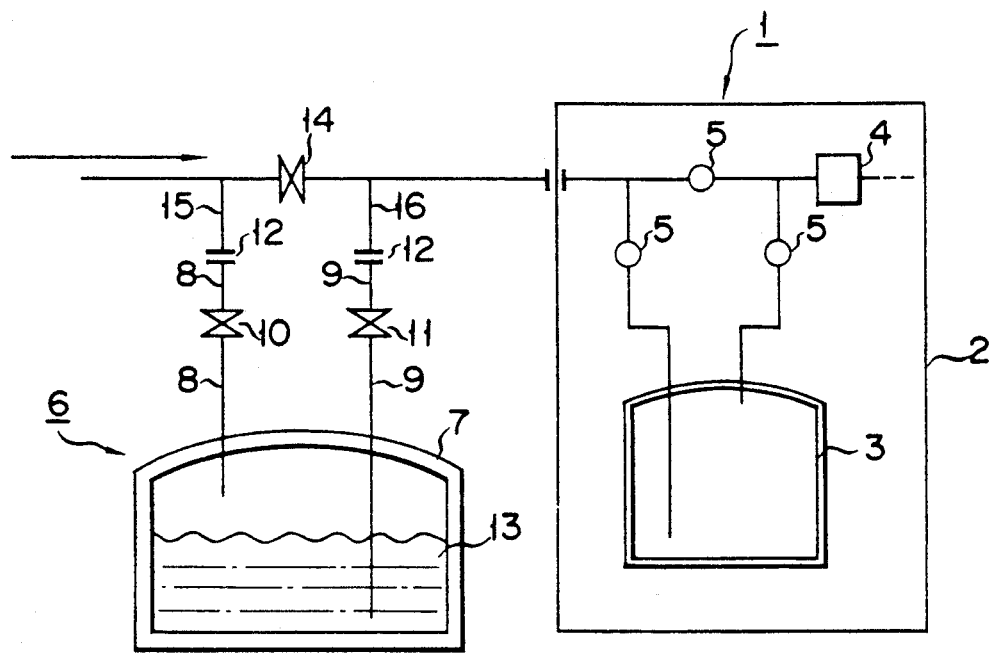
FIG. 1 illustrates a conventional source liquid container device and a conventional transferring system.

The conventional technique mentioned before has a problem such as contamination of the source liquid container device, the baking system, and the like due to the insufficient purge effect. In the purge-drying for the conventional container device 6 shown in FIG. 1, the purging inert gas does not flow through all of the pipe system since the delivery line 9 and the connection pipe 16 are too long. As a result, the source liquid left behind in the pipe cannot be completely removed, and the time period required for the purging becomes lengthy. To solve this problem, the source liquid container device 36 shown in FIG. 4 has been produced. In this container device 36, the purge line 43 and the purge valve 42 are taken as a part of the container device 36, and are provided adjacent to the main body 37 of the container device. With this structure, the purging inert gas directly flows through the section of the supply line 38 upstream the supply valve 40, and the section of the delivery line 39 downstream the delivery valve 41, as well as the connection pipe, etc. In other words, purging will cover up to the portion adjacent to the main body 37. The purging efficiency is thus improved greatly, and the problem of contamination is solved. Further, even in the case where the container device is removed by disjointing the joints 27a and 27b, the safety regarding the operator's health can be assured since the source liquid remaining in the pipes which are exposed to the open air has been completely purged. As far as this structure is concerned, a purge valve such as provided for the other case (the purge valve 14) is not essential.

However, with the source liquid container device 36, in case where either of the gas supply valve 40 and the delivery valve 41 is accidentally opened upon, for example, while removing the container device, the poisonous gas, i.e. the byproduct of the source liquid, is released in the room. Therefore, operation and handling of the device still require further attention.

The source liquid container device 26 shown in FIG. 2 has been invented in consideration of the above problem. FIG. 2 illustrates a structure of the source liquid container device 26, and FIG. 3 illustrates a case where the container device 26 is connected to the baking system 1. In addition to the valves 20 and 21, the container device 26 has the second gas supply valve 24 and the second source liquid delivery valve 25 which are also used as purge valves, besides ensuring the closed condition respectively.

This container device 26 is a remodeled version of the container device 36 shown in FIG. 4 which exhibits a remarkable purging efficiency, and it has, in addition to the characteristic of the container device 36, another characteristic, which is that the container device can be disconnected from the gas supply pipe 15 and the connection pipe 16 while holding an inert gas in the sections of the gas supply line 18, the purge line 23, and the delivery line 19 closed by the four valves 20, 21, 24 and 25 of the container device 26. Thus, the safety of the operation can be assured, and even if the first valve is accidentally opened, the second valve will cover, remarkably decreasing the possibility of direct contact between the source liquid and the atmosphere.

In both cases of the container device 26 and 36 shown in FIGS. 2 and 4, respectively, use of different types of joints, for example, male type joint 27a and female type joint 27b, for connecting with the gas supply pipe 15 and the connection pipe 16 respectively, is suggested to avoid transfer errors caused by joining a wrong joint.

FIG. 5, which includes a stop valve 28, illustrates another embodiment of the source liquid container device of the present invention. The container device 56 shown in this figure has a structure in which a heating mechanism 47 is provided for each of the supply line 58, the purge line 63, and connection pipe 16 is also aided with the heating mechanism 47. The first and second gas supply valves 60 and 64, the first and second source liquid of delivery valves 61 and 65, and the purge valve 62 may be of a heat-proof type, if necessary. This embodiment uses heater tapes (heaters built in insulation tapes) are wound around the pipes as the heat mechanisms 47.

With the above-stated structure, the heater is turned on to heat each pipeline and the connection pipe 16 of the container device 56 up to a predetermined temperature, and therefore the gasifying efficiency of the source liquid in the pipe can be improved. The optimum temperature should be determined in consideration of the heating material, the threshold temperature of each valve, and the type of the source liquid. In this embodiment, the above-mentioned heater tapes are employed and the temperature is set to 90°-100° C. Thus, the conventional vacuum suction purging method or vacuum suction $N_2$ purging method can be supported by the heat, and therefore the purge-drying time period is further shortened, and the purging efficiency is drastically raised. Consequently, the contamination of the pipe by silica, which sometimes happens in the embodiments shown in FIGS. 2 and 4 due to insufficient purging time period, can be completely avoided, and the inside of the pipe can be always maintained clean.

FIG. 6 shows an example of application of the present invention where the main body 57 of the container device 56 is directly used as a constant temperature tank. In this example, the main body 57 is immersed in a solution 51 heated in a constant temperature bath 52 and the heat mechanisms 47 are provided for the pipes. With this structure, this container device can have the function of a baking system, and in fact regular baking procedure can be operated. Thus, this application is very useful for a simple system. In the meantime, the container device is connected to the system in the reversed manner by the joints of the opposite type (male-female).

The source liquid handled in these embodiments is TEOS, though it is not limited to this organic source liquid. As stated before, the container device of the present invention is particularly useful for handling source liquids containing materials poisonous to human body.

Further, it is also suggested that the container device of the present invention be employed in gas supply companies. Especially, if the heating mechanisms are provided for the device as in the case of the container device 56, the safety of the operation for filling the container device with the gas can be further improved.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A liquid source container device for supplying a source liquid to a material tank, the liquid source container comprising:

a main body for containing the source liquid;

a gas supply line having a first end connected to said main body for introducing a supply gas to the main body to exert a pressure on the source liquid;

a first joint provided at a second end of the gas supply line opposite the first end for coupling the gas supply line to the material tank;

first and second gas supply valves provided on the gas supply line between the first and second ends of the gas supply line;

a source liquid delivery line having a first end connected to said main body for transferring the source liquid therefrom in response to the pressure exerted on the source liquid;

a second joint provided at a second end of the source liquid delivery line opposite the first end for coupling the source liquid delivery line to the material tank;

first and second source liquid delivery valves provided on the source liquid delivery line between the first and second ends of the source liquid delivery line;

a purge line having a first end connected to the gas supply line between the first and second gas supply valves, and a second end connected to the source liquid delivery line between the first and second source liquid delivery valves; and a purge valve provided on the purge line between the first and second ends of said purge line.

2. A container device according to claim 1, further including heating mechanisms provided for each of said gas supply line, said liquid delivery line, and said purge line.

3. A container device according to claim 1, wherein said container device is used for a liquid gas source for a semiconductor manufacturing device.

4. A container device according to claim 1, wherein said main body is employed as a constant temperature tank.

5. A container device according to claim 3, wherein said source liquid is an organic source liquid.

6. A container device according to claim 5, wherein said source liquid is an organic source liquid containing a doping material such as phosphor, boron, or arsenic.

7. A container device according to claim 1, wherein said first and second joints are of different types.

* * * * *